United States Patent [19]
Hsieh

[11] Patent Number: 5,892,676
[45] Date of Patent: Apr. 6, 1999

[54] RECTIFIER BRIDGES ASSEMBLY HAVING IMPROVED HEAT DISPERSING CHARACTERISTICS AND AN ARCING-FREE DESIGN

[76] Inventor: Joe C. Hsieh, 91 E. Gainsborough Rd., Thousand Oaks, Calif. 91360-3553

[21] Appl. No.: 958,627

[22] Filed: Oct. 27, 1997

[51] Int. Cl.[6] .............................. H02M 7/44; H02M 1/00; H05K 7/20
[52] U.S. Cl. .......................... 363/141; 363/144; 363/143; 361/697; 361/709
[58] Field of Search ..................................... 363/141, 125, 363/108, 44, 144; 361/697, 703, 709, 676, 124; 310/68 D

[56] References Cited

U.S. PATENT DOCUMENTS

| | | | |
|---|---|---|---|
| 3,697,814 | 10/1972 | Christman et al. | 310/68 D |
| 4,493,018 | 1/1985 | Hopmayer et al. | 363/145 |
| 5,473,208 | 12/1995 | Stihi | 310/68 D |

*Primary Examiner*—Peter S. Wong
*Assistant Examiner*—Rajnikant B. Patel
*Attorney, Agent, or Firm*—Kelly Bauersfeld Lowry & Kelley, LLP

[57] ABSTRACT

A rectifier bridges assembly for use with an automotive alternator includes a base plate conductively mounted to a ground and providing a negative heat sink, and an overlying finned positive heat sink structure having a surface area at least twice that of the base plate, which adjoins the base plate to cooperatively define a chamber therebetween. When utilized in connection with a standard 3-phase type AC electrical generator, three stator connection terminals are provided that each include an upper portion which extends through the positive heat sink structure in a non-conductive relation, and a lower portion disposed within the chamber and supported therein by a thermo-conductive, nonelectrically-conductive epoxy. Three diodes disposed within the chamber extend between the baseplate and respective ones of the stator connection terminals. Three additional diodes are disposed within the chamber between the respective stator connection terminals and the overlying positive heat sink structure. A stub is formed with the positive heat sink structure to which current output leads are attached. A voltage regulator lead wire extends through the positive heat sink structure to a selected one of the stator connection terminals.

17 Claims, 2 Drawing Sheets

RECTIFIER BRIDGES ASSEMBLY HAVING IMPROVED HEAT DISPERSING CHARACTERISTICS AND AN ARCING-FREE DESIGN

BACKGROUND OF THE INVENTION

This invention relates generally to rectifier bridges assemblies utilized with, for example, an automotive alternator. More specifically, the present invention relates to a rectifier bridges assembly having redesigned heat sinks and which eliminate the use of a connection plug between the rectifier bridges assembly and the current output leads to a battery.

A rectifier bridges assembly, commonly called a rectifier, is one of the components parts of an alternator assembly forming a portion of the electrical charging system in an automobile. The basic role of the charging system is to replenish the charge of a battery with electricity generated by the alternator. The electrical current generated by the alternator is an alternating current (AC), while the electrical current preserved in the battery is a direct current (DC). The alternating current must be converted to a direct current so that the battery can be charged. This conversion is called rectification, and is the specific function of a rectifier bridges assembly.

The alternator used in a typical automobile is a three-phase type of alternating current (AC) electrical generator. The electricity generated by each phase must be rectified by one rectifier bridge. Each rectifier bridge consists of two diodes and, thus, three rectifier bridges are required for one alternator. Therefore, a typical rectifier bridges assembly consists of three rectifier bridges with six diodes. Three of the six diodes are connected to a ground, and the other three diodes are connected for DC output charging to the battery.

During the rectification process, tremendous amounts of heat are generated by converting the alternating current (AC) to direct current (DC). The heat must be dissipated as quickly and efficiently as possible, or the diodes may be ruined within a relatively short period of time. Therefore, the rectifier bridges are normally soldered onto heat sinks of good heat-conductive materials. Usually a portion of the ground provides a negative heat sink, and some structure associated with the DC output charging to battery provides a positive heat sink that is conductively and terminally isolated from the ground.

Rectifier bridges assemblies are normally assembled as an integrated part of an alternator assembly. The electrical current output of the alternator to the battery greatly depends on the capacity of the rectifier bridges assembly to rectify the alternating current to a direct current. However, the rectification ability of the rectifier bridges assembly with the diodes at a set power level depends heavily on the heat disbursing ability of the heat sinks utilized. The faster heat can be disbursed from the rectifier bridges assembly, the cooler the rectifier can operate. The rectifier also has a longer life and a greater rectification capacity. Hence, the capacity of the heat sink(s) should be a major concern in the design of a rectifier bridges assembly.

Most rectifier bridges assemblies used in automobiles have two heat sinks, one for the negative side and the other for the positive. This, however, is not always the case. For example, in the rectifier bridges assembly used on Ford Motor Company's 2 G alternators, all six diodes are soldered onto only one heat sink within an area not greater than 3.6 square inches. This particular design, which is common in the industry, tends to have a very poor heat disbursing capacity. Besides the small heat sink area, the current output leads are connected with a socket and plug and are both constructed of a plastic housing. Electrical arcing occurs between the terminals of the socket and plug due to constant vibration while the alternator is working. The poor heat disbursing capacity of such rectifiers makes them fail much easier and prematurely, and the electrical arching inherent in the socket and plug design burns or corrodes the connection terminals.

Accordingly, there has been a need for a novel rectifier bridges assembly that overcomes the above-noted problems in prior art designs by utilizing two separate heat sinks and by eliminating the use of socket and plug connections to make the design electrically arching-free. Such a novel rectifier bridges assembly must be adapted for use with standard alternator assemblies and have a design that may be manufactured cost effectively. The present invention fulfills these needs and provides other related advantages.

SUMMARY OF THE INVENTION

The present invention resides in an improved rectifier bridges assembly that has improved heat disbursing ability and an electrical arcing-free design. The assembly comprises, generally, a base plate conductively mounted to a ground and providing a negative heat sink, and an overlying finned positive heat sink structure which adjoins the base plate to cooperatively define a chamber therebetween. At least one stator connector terminal is provided that has an upper portion which extends through the positive heat sink structure in a non-conductive relation, and a lower portion disposed within the chamber. First diode means are disposed between the base plate and the at least one stator connection terminal, and second diode means are disposed between the at least one stator connection terminal and the overlying positive heat sink structure.

In a preferred form of the invention, a rectifier bridges assembly is disclosed for use with an automotive alternator. In this embodiment, the base plate is mounted to the alternator which serves as the ground for the assembly. To improve the heat disbursing characteristics of the assembly, the positive heat sink structure is constructed so as to have a surface area that is at least twice that of the base plate. This is accomplished, in part, by providing a heat disbursing finned structure.

Means are further provided for connecting the base plate to the overlying positive heat sink structure in a nonelectrically-conductive relation. The connecting means comprises an insulation gasket that is disposed between facing surface of the base plate and the positive heat sink structure, and insulative connecting pins.

In the preferred embodiment, the at least one stator connection terminal comprises three stator connection terminals that each receive alternating current from the alternator. The stator connection terminals are supported within the chamber by means of a thermo-conductive, nonelectrically-conductive epoxy. The first diode means comprises three diodes which are each disposed between the base plate and a respective one of the three stator connection terminals. Similarly, the second diode means comprises three diodes which are each disposed between a respective one of the stator connection terminals and the overlying positive heat sink structure.

Means are provided for directly attaching a current output lead to the positive heat sink structure. The attaching means comprises a stub that is integrally formed with the positive heat sink structure to which the current output lead is attached. Once the attachment is made, shrink tubing is placed about the connection between the current output lead and the stub, and subsequently heat actuated to securely hold the current output lead in place upon the stub. Further, a voltage regulator lead wire is provided that extends through the positive heat sink structure to a selected one of the stator connection terminals.

Other features and advantages of the present invention will become apparent from the following more detailed description, taken in conjunction with the accompanying drawings which illustrate, by way of example, the principles of the invention.

BRIEF DESCRIPTION OF THE DRAWINGS

The accompanying drawings illustrate the invention. In such drawings.

DETAILED DESCRIPTION OF THE PREFERRED EMBODIMENT

Figure 7:
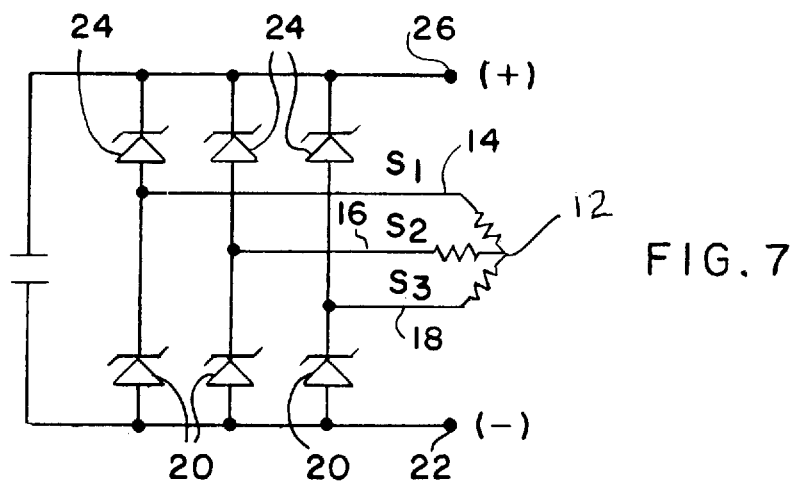
FIG. 7 is an electrical schematic of the rectifier bridges assembly of FIGS. 1–6.

As shown in the drawings for purposes of illustration, the present invention is concerned with an improved rectifier bridges assembly, generally designated in the accompanying drawings by the reference number 10. The improved rectifier bridges assembly 10 serves to rectify alternating current produced by, for example, an automotive alternator, to a direct current suitable for reception and storage within an automobile battery. The electrical schematic of the rectifier bridges assembly 10 of the present invention is identical to that for a standard rectifier, as illustrated in FIG. 7. As shown, electricity generated at the stator 12 of an automotive alternator is fed into one of three stator connection terminals 14–18. A first set of diodes 20 is disposed between a ground (−) 22 and a respective one of the three stator connection terminals 14–18, and a second set of diodes 24 is disposed between a respective one of the stator connection terminals 14–18 and an output to the battery (+) 26.

In accordance with the present invention, and with reference to FIGS. 1–6, the rectifier bridges assembly 10 comprises an aluminum or copper base plate 28 that is mounted directly to the alternator assembly, and which provides a negative heat sink for the assembly. A positive heat sink structure 30 overlies the base plate 28 and, with the base plate 28, cooperatively defines a chamber 32 therebetween. The positive heat sink structure 30 includes a base portion 34 that adjoins the base plate 28 in a non-conductive manner, and a finned portion 36 that is spaced from the base plate 28 by the base portion 34. An insulation gasket 38 is disposed between the adjoining portions of the base plate 28 and the positive heat sink structure 30.

Figure 1:
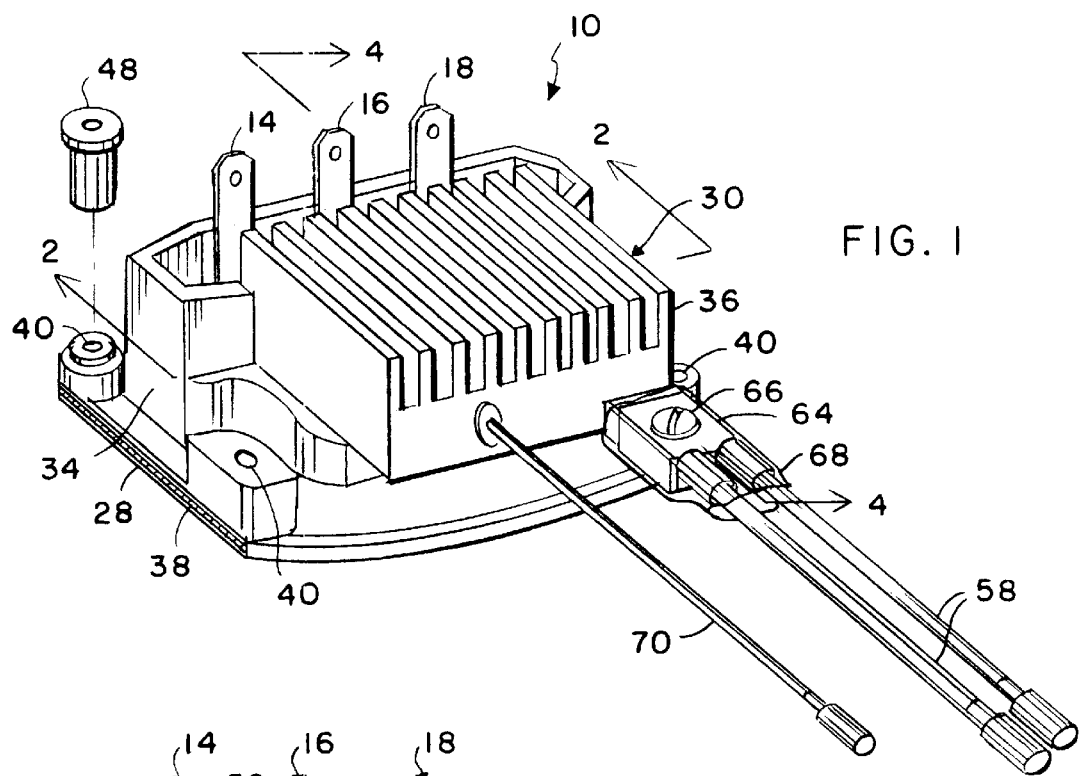
FIG. 1 is a top, front and side perspective view of a rectifier bridges assembly embodying the invention.
Figure 2:
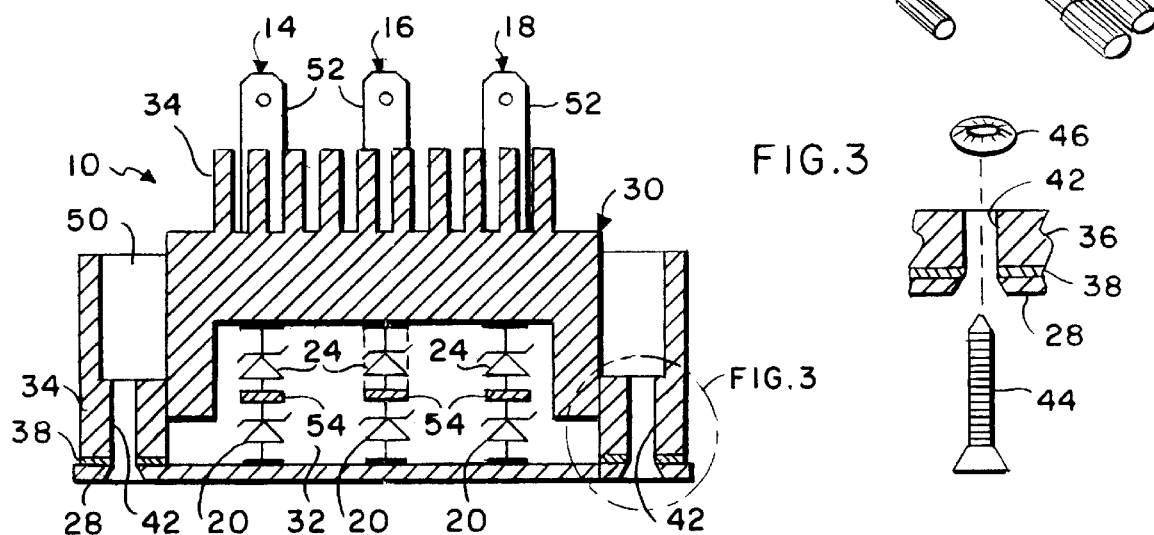
FIG. 2 is an elevational section taken generally along the line 2—2 of FIG. 1.
Figure 3:
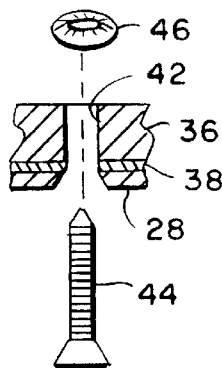
FIG. 3 is an enlarged, fragmented elevational section of the area indicated by the number 3 in FIG. 2, illustrating the use of an electrically insulative connecting pin for attaching an overlying finned positive heat sink structure to an underlying base plate the provides a negative heat sink.
Figure 4:
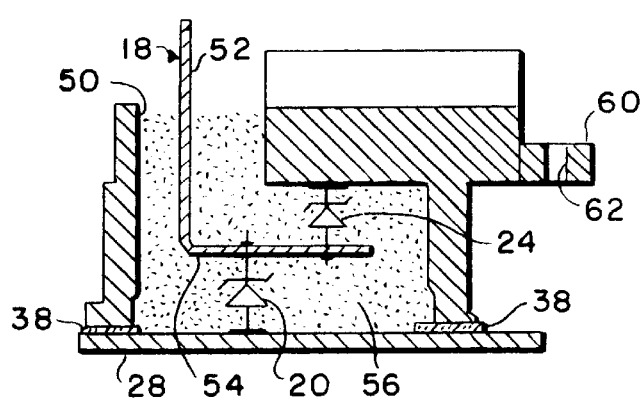
FIG. 4 is an elevational section taken generally along the line 4—4 of FIG. 1.
Figure 5:
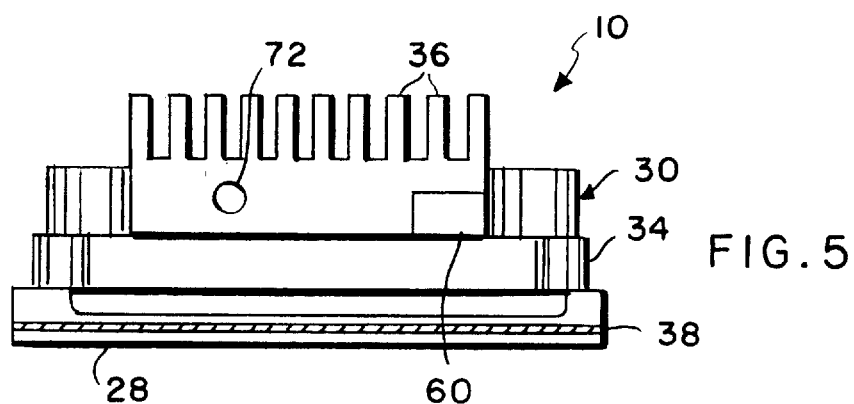
FIG. 5 is a front elevational view of the rectifier bridges assembly of FIG. 1, wherein the battery lead wires and the voltage regulator wire have been removed.
Figure 6:
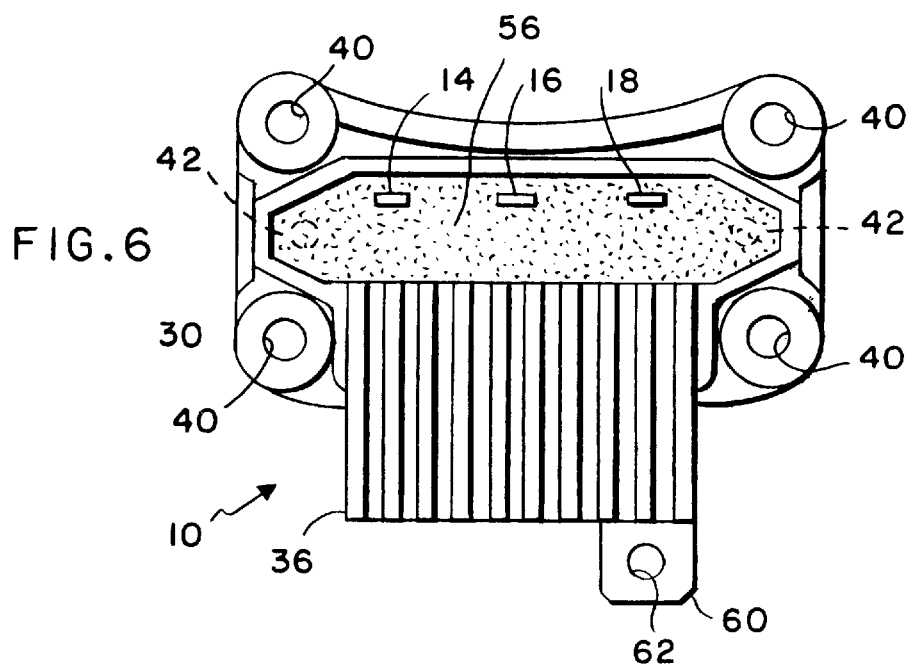
FIG. 6 is a top plan view of the rectifier ridges assembly.

The base plate 28 and the positive heat sink structure 30 each have six apertures therethrough which are aligned with one another. Four mounting apertures 40 are provided at the corners of the rectifier bridges assembly 10 to facilitate mounting of the assembly 10 to an underlying structure such as a portion of the automotive alternator. A pair of connecting apertures 42 are further provided to fix the base plate 28 to the positive heat sink structure 30. As illustrated in FIG. 3, the base plate portion of the connecting apertures 42 are tapered so as to receive and flush mount the head of a plastic pin 44 that is inserted through the base plate 28 upwardly through the aligned connecting apertures 42 and retained in place by means of a snap ring 46. In the illustrated embodiment, two plastic pins 44 inserted through the two connecting apertures 42 and maintained in place by the snap rings 46 are sufficient to securely hold the base plate 28 adjacent to a lower surface of the positive heat sink structure 30. As shown in FIG. 1, insulation sleeves 48 are provided through the mounting apertures 40 so as to maintain the nonelectrically conductive relationship between the base plate 28 and the positive heat sink structure 30.

The positive heat sink structure 30 of the rectifier bridges assembly 10 is designed such that the surface area thereof is at least twice that of the base plate 28. This improves the heat disbursive capacity of the rectifier bridges assembly 10 significantly in comparison with prior art devices. The positive heat sink structure 30 defines a passageway 50 to the chamber 32 defined between the positive heat sink structure and the base plate 28. Three stator connection terminals 14, 16 and 18 are disposed within the chamber 32 and the passageway 50. In particular, each of the stator connector terminals 14–18 include an upper portion 52 extending through the passageway 50 in a non-conductive relation to the positive heat sink structure 30, and a lower portion 54 that is disposed within the chamber 32. The upper portion 52 of the stator connection terminals 14–18 each receive alternating current (AC) from the alternator. Rectification of the alternating current (AC) to a direct current (DC) is realized by providing a first diode 20 between the base plate 28 and the lower portion 54 of each stator connection terminal 14–18, and by providing a second diode between the lower portion 54 of each stator connection terminal 14 and the overlying positive heat sink structure 30. An electrical connection between the diodes 20 and 24 and the stator connection terminals 14–18, the base plate 28 and the overlying positive heat sink structure 30 is by any suitable means, and preferably by soldering. Further, the stator connection terminals are supported within the chamber 32 by filling the chamber with a thermo-conductive, nonelectrically-conductive epoxy 56.

Since the rectified direct current (DC) is shunted directly to the positive heat sink structure 30, all that remains is to provide a suitable attachment between the positive heat sink structure 30 and current output leads 58 to a battery. In this regard, the positive heat sink structure 30 includes a stub 60 that is integrally formed with the finned portion 36 of the positive heat sink structure 30. The stub 60 includes a central threaded aperture 62. The battery lead wires 58 may be provided a suitable stub receiving connector 64 into which the stub 60 may be inserted. A screw 66 may then be utilized to securely fix the connector, and thus the battery lead wires 58, to the stub 60. Once this connection is effected, shrink tubing 68 may be placed about the connector 64 and heat actuated to securely hold the current output lead wires 58 in place relative to the stub 60.

As it is desirable to provide a lead wire 70 from one of the stator connection terminals 14–18 to a voltage regulator, the finned portion 36 of the positive heat sink structure 30 is provided an aperture 72 through which the voltage regulator lead wire may pass.

From the foregoing it will be appreciated that the rectifier bridges assembly 10 of the present invention incorporates a design that is far more capable of dissipating heat efficiently than prior rectifier designs. Further, the design of the rectifier bridges assembly 10 of the present invention eliminates any plug and socket between the battery leads 58 and an associated structure, thus eliminating the problem of electrical arcing.

Although a particular embodiment of the invention has been described in detail for purposes of illustration, various modifications may be made without departing from the spirit and scope of the invention. Accordingly, the invention is not to be limited, except as by the appended claims.

I claim:

1. A rectifier bridges assembly, comprising:
   a base plate conductively mounted to a ground and providing a negative heat sink;
   an overlying finned positive heat sink structure adjoining the base plate to cooperatively define a chamber therebetween;
   at least one stator connection terminal including an upper portion extending through the overlying positive heat sink structure in a non-conductive relation, and a lower portion disposed within the chamber;
   first diode means disposed between the base plate and the at least one stator connection terminal;
   second diode means disposed between the at least one stator connection terminal and the overlying positive heat sink structure; and
   a stub integrally formed with the positive heat sink structure, for directly attaching a current output lead to the positive heat sink structure.

2. The assembly of claim 1, including shrink tubing placed about the connection between the current output lead and the stub.

3. The assembly of claim 1, including means for supporting the at least one stator connection terminal within the chamber.

4. The assembly of claim 3, wherein the supporting means comprises a thermo-conductive, nonelectrically-conductive epoxy.

5. The assembly of claim 1, wherein the at least one stator connection terminal comprises three stator connection terminals that each receive alternating current (AC) from an alternator, wherein the first diode means comprises three diodes each being disposed between the base plate and a respective one of the three stator connection terminals, and wherein the second diode means comprises three diodes each disposed between a respective one of the stator connection terminals and the overlying positive heat sink structure.

6. The assembly of claim 5, including a voltage regulator lead wire extending through the positive heat sink structure to a selected one of the stator connection terminals.

7. The assembly of claim 1, including means for connecting the base plate to the overlying positive heat sink structure in a nonelectrically-conductive relation.

8. The assembly of claim 7, wherein the connecting means comprises an insulation gasket disposed between facing surfaces of the base plate and the positive heat sink structure, and insulative connecting pins.

9. The assembly of claim 1, wherein the surface area of the positive heat sink structure is at least twice that of the base plate.

10. A rectifier bridges assembly for use with an automotive alternator, comprising:
    a base plate mounted to the alternator and providing a negative heat sink;
    an overlying finned positive sink structure adjoining the base plate to cooperatively define a chamber therebetween, the surface area of the positive heat structure being at least twice that of the base plate;
    at least one stator connection terminal including an upper portion extending through the overlying positive heat sink structure in a non-conductive relation, and a lower portion disposed within the chamber, the at least one stator connection terminal being supported within the chamber by means of a thermo-conductive, nonelectrically-conductive epoxy;
    first diode means disposed between the base plate and the at least stator connection terminal;
    second diode means disposed between the at least one stator connection terminal and the overlying positive heat sink structure;
    a stub integrally formed with the positive heat sink structure, for directly attaching a current output lead to the positive heat sink structure; and
    a voltage regulator lead wire extending through the positive heat sink structure to the at least one stator connection terminal.

11. The assembly of claim 10, including shrink tubing placed about the connection between the current output lead and the stub.

12. The assembly of claim 10, including means for connecting the base plate to the overlying positive heat sink structure in a nonelectrically-conductive relation, wherein the connecting means comprises an insulation gasket disposed between facing surfaces of the base plate and the positive heat sink structure, and insulative connecting pins.

13. A rectifier bridges assembly for use with an automotive alternator, comprising:
    a base plate mounted to the alternator and providing a negative heat sink;
    an overlying finned positive heat sink structure adjoining the base plate to cooperatively define a chamber therebetween, the surface area of the positive heat sink structure being at least twice that of the base plate;
    means for connecting the base plate to the overlying positive heat sink structure in a nonelectrically-conductive relation;
    a plurality of stator connection terminals which each receive alternating current (AC) from the alternator and including an upper portion extending through the overlying positive heat sink structure in a non-conductive relation, and a lower portion disposed within the chamber, wherein the stator connection terminals are supported within the chamber by means of a thermo-conductive, nonelectrically-conductive epoxy;
    a plurality of first diodes each being disposed between the base plate and a respective one of the plurality of stator connection terminals;
    a plurality of second diodes each disposed between a respective one of the stator connection terminals and the overlying positive heat sink structure; and
    means for directly attaching a current output lead to the positive heat sink structure, including a stub integrally formed with the positive heat sink structure to which the current output lead is attached.

14. The assembly of claim 13, including shrink tubing placed about the connection between the current output lead and the stub.

15. The assembly of claim 13, including a voltage regulator lead wire extending through the positive heat sink structure to a selected one of the stator connection terminals.

16. The assembly of claim 13, wherein the connecting means comprises an insulation gasket disposed between facing surfaces of the base plate and the positive heat sink structure, and insulative connecting pins.

17. A rectifier bridges assembly for use with an automotive alternator, comprising:

a base plate mounted to the alternator and providing a negative heat sink;

an overlying finned positive heat sink structure adjoining the base plate to cooperatively define a chamber therebetween, the surface area of the positive heat sink structure being at least twice that of the base plate;

means for connecting the base plate to the overlying positive heat sink structure in a nonelectrically-conductive relation, including an insulation gasket disposed between the facing surfaces of the base plate and the positive heat sink structure, and insulative connecting pins;

'at least one stator connection terminal' which receives alternating current (AC) from the alternator and including an upper portion extending through the overlying positive heat sink structure in a non-conductive relation, and a lower portion disposed within the chamber, the at least one stator connection terminal being supported within the chamber by means of a thermo-conductive, nonelectrically-conductive epoxy;

first diode means disposed between the base plate and the 'at least stator connection terminal';

second diode means disposed between the 'at least one stator connection terminal' and the overlying positive heat sink structure;

attaching means, comprised of a stub integrally formed with the positive heat sink structure, for directly connecting a current output lead to the positive heat sink structure;

a shrink tubing placed about the connection between the output lead and the stub; and a voltage regulator lead wire extending through the positive heat sink structure to the 'at least one of the stator connection terminal'.

* * * * *